United States Patent [19]
Edelkind et al.

[11] Patent Number: 6,045,980
[45] Date of Patent: *Apr. 4, 2000

[54] OPTICAL DIGITAL MEDIA RECORDING AND REPRODUCTION SYSTEM

[75] Inventors: Jamie Edelkind, Kennesaw; Ilya M. Vitebskiy, Smyrna; Dmitri A. Choutov, Marietta, all of Ga.

[73] Assignee: Leybold Systems GmbH, Hanau, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/720,074

[22] Filed: Sep. 27, 1996

Related U.S. Application Data

[60] Provisional application No. 60/004,562, Sep. 29, 1995.

[51] Int. Cl.[7] .................................................. G03F 5/20
[52] U.S. Cl. ........................ 430/320; 430/945; 355/104; 355/106
[58] Field of Search ............................. 355/104, 110, 355/111, 108, 106; 264/1.6, 1.7, 1.33, 1.38; 430/320, 323, 945

[56] References Cited

U.S. PATENT DOCUMENTS

| | | | |
|---|---|---|---|
| 3,655,379 | 4/1972 | Gundlach | 96/27 |
| 3,658,954 | 4/1972 | Broadben | 264/1.38 |
| 3,664,737 | 5/1972 | Lipp | 430/945 |
| 3,687,664 | 8/1972 | Broadben | 96/35.1 |
| 3,688,025 | 8/1972 | Whittemore | 178/6.6 |
| 3,712,735 | 1/1973 | Crumley et al. | 355/110 |
| 3,924,093 | 12/1975 | Feldman et al. | 430/945 |
| 3,931,459 | 1/1976 | Korpel | 178/6.6 |
| 4,037,957 | 7/1977 | Lallement | 355/104 |
| 4,214,249 | 7/1980 | Kasai et al. | 430/270.12 |
| 4,225,873 | 9/1980 | Winslow | 369/61 |
| 4,313,191 | 1/1982 | Winslow | 369/275 |
| 4,321,317 | 3/1982 | MacIver | 430/5 |
| 4,423,137 | 12/1983 | Rester | 430/320 |

(List continued on next page.)

FOREIGN PATENT DOCUMENTS

| | | |
|---|---|---|
| 0405898A2 | 1/1991 | European Pat. Off. . |
| 0692741B1 | 1/1996 | European Pat. Off. . |
| 20 53 002 | 5/1978 | Germany . |
| 43 13 111 A1 | 10/1994 | Germany . |
| 56-065136 | 6/1981 | Japan . |
| 57-2041 | 1/1982 | Japan . |
| 60-052944 | 3/1985 | Japan . |
| 60-52941 | 3/1985 | Japan . |
| 60-52943 | 3/1985 | Japan . |
| WO96/22598 | 7/1996 | WIPO . |

OTHER PUBLICATIONS

McGraw–Hill Dictionary of Physics and Mathematics, copyright 1978, pp. 700 and 983.

Seres, Zoltan, et al., *Optical Engineering* "Optical Transmission of Mylar and Teflon Films" Sep. 1994, vol. 33 pp. 3031–3032.

Williams, E.W., *Oxford Science Publications* "The CD–ROM and Optical Disc Recording Systems" 1994, pp. 1–166.

Slafer, W. Dennis, *SPIE* vol. 1663 "Continuous Manufacturing of Thin Cover Sheet Optical Media" (1992), pp. 324–335.

Ooki, H., *Optical and Quantum Electronics 25,* Development of Optical Disk Technology in the 1990s, (1993) pp. S587–S595.

*Primary Examiner*—Martin J. Angebranndt
*Attorney, Agent, or Firm*—Needle & Rosenberg, P.C.

[57] ABSTRACT

The present invention provides a new method and system for producing a digital optical recording. The process can be divided into two separate operations: mastering of the optical recording on the surface of an elongated member, such as a cylinder, etc., and fast replication of the master record onto the surface of flexible film which is essentially parallel to the surface of the cylinder, etc.

11 Claims, 7 Drawing Sheets

U.S. PATENT DOCUMENTS

| | | | |
|---|---|---|---|
| 4,439,848 | 3/1984 | Ceshkovsky et al. | 369/45 |
| 4,488,275 | 12/1984 | Ceshkovsky et al. | 369/44 |
| 4,500,484 | 2/1985 | Gregg | 264/107 |
| 4,535,548 | 8/1985 | Hyde | 34/4 |
| 4,615,753 | 10/1986 | Gregg | 156/219 |
| 4,659,407 | 4/1987 | Lacotte et al. | 156/196 |
| 4,836,874 | 6/1989 | Foster | 156/209 |
| 4,868,808 | 9/1989 | Tinet | 369/275 |
| 4,888,266 | 12/1989 | Lacotte et al. | 430/141 |
| 4,898,297 | 2/1990 | Gregg | 369/275 |
| 4,925,776 | 5/1990 | Ohta et al. | 430/320 |
| 5,147,763 | 9/1992 | Kamitakahara | 430/320 |
| 5,230,770 | 7/1993 | Kashiwagi | 156/643 |
| 5,281,511 | 1/1994 | Gerhardt | 430/320 |
| 5,321,680 | 6/1994 | Bailey | 369/59 |
| 5,373,490 | 12/1994 | Bailey | 369/59 |
| 5,459,709 | 10/1995 | Bailey | 369/275 |
| 5,494,782 | 2/1996 | Maenza | 430/321 |
| 5,521,030 | 5/1996 | McGrew | 430/1 |
| 5,575,961 | 11/1996 | Kuwabara et al. | 264/1.6 |

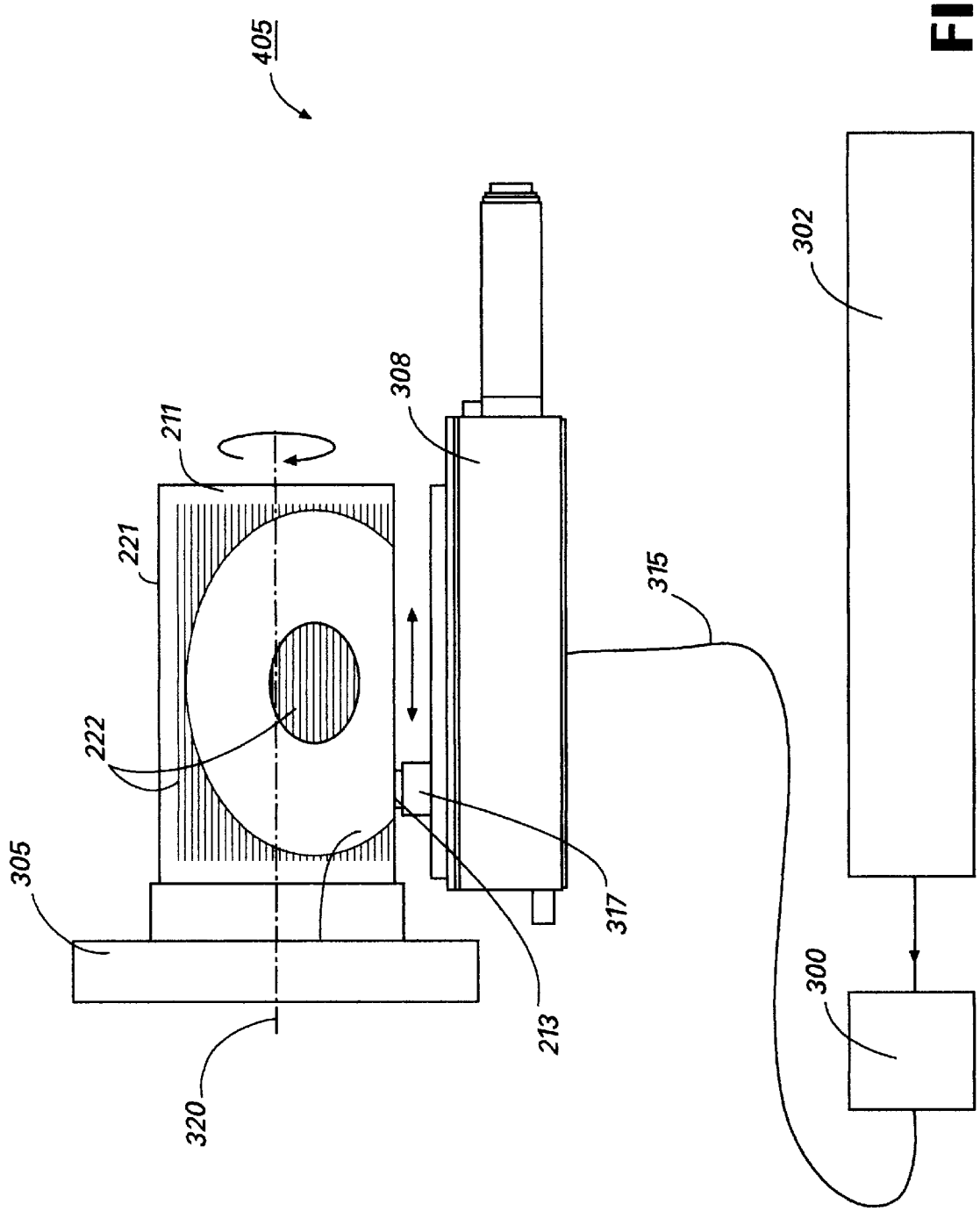

| 601 n{φ,r} | 602 φ(r) | 603 r(n) | 604 x(n) | 605 y(n) | 606 n{x,y} |
|---|---|---|---|---|---|
| 1 | 0.1 | 25 | 848751 | 624958 | 8 |
| 2 | 0.7 | 27 | 806507 | 773939 | 7 |
| 3 | 1.5 | 31 | 621929 | 909223 | 6 |
| 4 | 1.9 | 34 | 490082 | 921742 | 5 |
| 5 | 2.3 | 35 | 366803 | 860996 | 3 |
| 6 | 2.8 | 37 | 251777 | 723945 | 2 |
| 7 | 3.5 | 41 | 216052 | 456179 | 1 |
| 8 | 4.2 | 42 | 394090 | 233998 | 4 |
| 9 | 5.7 | 46 | 983968 | 346685 | 9 |
| 10 | 6.0 | 51 | 1089687 | 457498 | 10 |

FIG.7A  FIG.7B

OPTICAL DIGITAL MEDIA RECORDING AND REPRODUCTION SYSTEM

This patent application claims the benefit of U.S. Provisional Application No. 60/004,562, filed Sep. 29, 1995.

BACKGROUND OF THE INVENTION

1. Field of the Invention

The present invention relates generally to a system for mastering, recording and replicating optical digital media, such as optical digital discs.

2. Description of the Prior Art

Digital Compact Disc technology was developed over twenty years ago by various organizations, including Philips Electronics, Sony, Thomson and Discovision Associates (DVA). This technology (with extensions and improvements) has been adopted as a standard by the largest consumer electronics and computer companies in the world. The relatively large storage capacity and low unit cost of both the discs and the playback units have resulted in worldwide sales and licensing revenues measuring many billions of dollars per year, exclusive of the content of the discs themselves. This technology has become a worldwide standard for permanent digital data storage of all types.

Digital Compact Discs (or "CDs") consist of a disc made of high-grade plastic approximately 120 mm in diameter and 1.2 mm thick coated with a thin (50 nm) layer of aluminum. These discs may contain up to 1.2 billion bytes of digital information. Commonly used error correction schemes typically reduce the effective storage capacity of these discs to approximately 680 million bytes of digital information.

The basic underlying principal of the digital optical recording implemented in Compact Disc technology is the local reflectivity modulation where the pluralities of areas with high and low reflectivity represent individual bits of data. The most common method for local reflectivity modulation is so called "phase pit" method. The phase pits must be exactly as deep as the length of one quarter of the wavelength of the light source reading the data (approximately 120 nm). The phase pits can be replaced by amplitude objects where reflectivity is reduced due to discontinuity in the reflective coating or because of the light scattering on convex or concave microscopic features.

The pits (or the amplitude objects) on CDs are arranged in a spiral pattern beginning about 20 mm from the center of "hub" of the disc and continuing in a single spiral track to within a few mm of the outside edge of the disc. The entire length of this spiral track is considered to be a long line of locations where phase pits may or may not exist. If red laser light bouncing off a location detects a pit, a photodetector and related circuits interpret its presence as the number "1". If the location does not contain a pit, this will be interpreted to be "0" (zero). This continuous string of ones and zeros comprises the digital information recorded on the disc. The nominal width of a pit is 0.6 $\mu$m; the distance between one loop of the spiral track and either its inner or outer neighboring loop is 1.6 $\mu$m.

The existing industrial process for making CDs can be divided into three separate operations: mastering, stamper production, and replication. The general steps of prior art CD processing are described below.

A. Mastering
1. Data is premastered according to a specific format;
2. An optically polished glass disk (or the glass master) coated with a photoresist layer is provided;
3. The glass master is exposed in a laser beam recorder by a focused laser beam modulated accordingly to the premastered data. The focused laser beam follows a spiral trajectory on the surface of the glass master with the light intensity turned on and off by an acousto-optical modulator. The exposed areas of the photoresist layer correspond to position and dimension of the phase pits;
4. The glass master is developed, and exposed areas of photoresist are washed out;
5. An inspection may be performed after each step described above.

B. Stamper production
1. A thin layer of silver is deposited over the photoresist pattern on the glass stamper by vacuum evaporation;
2. A thick layer of nickel is deposited over silver the by electroplating, forming a nickel plate father. One father is produced;
3. The nickel father is a negative replica of the glass master (i.e. protrusions correspond to the phase pits). The nickel father can be used as an injection molding stamper, but it is usually not used as a stamper given its high cost to produce. For this reason, several mothers (positive replicas) are produced by electroplating and separation;
4. Stampers (negative copies of the glass master) are produced from the mothers by electroplating and separation;
5. An inspection may be performed after each step described above.

C. Replication
1. The nickel stamper is used in a high pressure injection molding of polycarbonate CD substrates;
2. After cooling the substrate is coated with a reflective layer of aluminum by sputtering;
3. A protective layer is spin-coated atop of the aluminum layer and subsequently cured by UV radiation;
4. The diffraction efficiency of the spiral tracks is used as a final inspection criterion.

The labeling and packaging steps involved in producing replicas are excluded from the above description of the prior art because they are carried out most commonly off-line. The mastering operation (including photoresist spinning and deposition) typically requires 3–4 hours in a class 100 cleanroom facility. Stamper production requires 5–8 hours in a class 100 cleanroom facility. Finally, an efficient injection molding replication yields on average 1 CD per 4 seconds.

The above-described prior art manufacturing method for CDs has, among others, the following disadvantages:

The mastering and stamper production require prolonged use of expensive equipment and facilities;

The prior art process is low speed and discrete. Each CD is handled separately; and it takes on at least 4 seconds to fabricate a CD, a relatively lengthy amount of time;

The prior art process involves high temperature and high pressure. The plastic melts at a temperature of approximately 300° C., and is injected with a force 20–40 tons. Because of significant nonuniformly distributed stresses due to the high pressure injection and temperature gradients during rapid cooling, the birefringence problem (i.e. anisotropy of the refraction index) arises;

In order to minimize the birefringence arising from process-induced optical nonuniformities, a very expensive polycarbonate plastic is used as a substrate material;

The synthesis process for the polycarbonate resins of the substrate include a chlorinating step. Residual chlorine atoms attack the reflective aluminum coating of a CD, reducing the CD's expected lifetime;

Due to the complexity and vulnerability of the injection molding process, very high capital investment is required to meet the rapidly growing demand for audio CD's and CD ROM's;

Today, a commercially viable plant can be built for US$75 million; very large facilities can require over US$1 billion. Using ultrapure materials, CDs can be produced with a fully burdened cost of at least approximately US 40 cents per unit.

In order to overcome some of the problems associated with the prior art, alternatives to the above-described prior art methodology have been developed. For example, it has been proposed that mechanical and temperature stress can be reduced where a method of embossing is used instead of injection molding. In this technique, phase pits are replaced by amplitude objects. The reflectivity of the amplitude objects is reduced because of light scattering at the edges as well as due to the discontinuities in the metal coating selectively deposited by the shadow mask method. Because of the complexity of the shadow mask fabricated by the metal evaporation, as well as other disadvantages, the embossing method has not to date become a viable commercial option.

Another alternative for the high temperature/high pressure injection molding process is the contact photolithography replication method suggested by U.S. Pat. No. 4,423,137, assigned to Quixote Corporation, aid generally depicted in FIGS. 1A, 1B, 1C and 1D. As shown in FIG. 1A, this process consists of the use of contact photolithography with a flat rigid master mask, which may comprise a flat glass substrate 1 coated with a layer of reflective metal 2 having apertures 3 corresponding to the pit pattern of a CD. The flat rigid master mask is replicated onto a flat rigid substrate 4 covered by a reflective layer 5 and a photoresist layer 6. In FIG. 1B, the areas 61 of the photoresist 6 are exposed to light, and are removed, exposing the underlying areas 51 of the reflective coating 5. In FIG. 1C, the areas 51 are then etched, and the photoresist 6 is removed in FIG. 1D. The resulting structure represents the plurality of amplitude objects sized and distributed over the surface of the substrate corresponding to openings in the reflective coating on the master plate. In the subsequent steps of applying a protective coating, laminating onto a rigid transparent disk, and labeling, a CD compatible with the ISO 9660 standard may be produced.

Contact photolithography has been well known since the early 1960s as a method for microscopic pattern transfer in semiconductor device fabrication. The main requirement for the successful implementation of contact lithography is to reduce the gap between the photomask (e.g., metal patterned master plate 1 and 2 in FIG. 1A) and the photoresist coating 61 of the substrate 4. This requirement can arguably be met for small surface areas (1–5 cm$^2$), but it becomes extremely difficult, if not impossible, to reliably control the gap for large flat surface areas—for example a 12 cm in diameter CD substrate. Moreover, if contact lithography is intended to be applied for a high throughput replication process, it becomes impossible to maintain a uniformly small gap between the master and the substrate. For this and other reasons, the replication process described generally in U.S. Pat. No. 4,123,137, though possible in theory, cannot be implemented in commercial practice.

It is generally accepted that a continuous manufacturing process has substantial advantages over a batch or discrete process, as a continuous process is much faster, more reliable and less expensive. Obviously, injection molding techniques of the prior art are essentially discrete methods for CD manufacturing. Thus, the introduction of a continuous CD replication method would constitute a substantial improvement over the prior art.

A publication entitled "Continuous Manufacturing of Thin Cover Sheet Optical Media", written by W. Dennis Slafer et al. of Polaroid Corporation, and published in SPIE Vol. 1663 Optical Data Storage (1992) at page 324 (the "Polaroid article"), discloses a continuous manufacturing method for CDs. In this method, a continuous web of a thin film substrate is embossed by micro protrusions on the surface of a roller, and consequently is metallized to achieve reflectivity, and is laminated onto a thick transparent plastic sheet in order to add the thickness up to the standard value. This composite plastic web is handled and transported with constant speed during the entire replication process until it is separated into individual CDs. The replication method introduced by the Polaroid article utilizes well-known techniques for the continuous web handling, printing, and lamination. However, microembossing of a plastic film by microscopic protrusions on a curved surface of a roller is difficult to control, especially at high velocities of the web. Thus, this prior art technique also has significant disadvantages that make it impractical as an effective method for replicating CDs.

It is worth noting that the existing standard for CD Audio and CD ROM media is currently being replaced by a new standard which provides a greater information storage capacity. The competing new standard such as Digital Video Disc (DVD) utilizes smaller micro-features and smaller track pitch arranged in multilayer structures. With these new requirements, the potential of the prior art injection molding method is approaching its limit in the microscopic spatial resolution as well as for the process yield. Additionally, the new CD technology is making other known prior art replication techniques even more impractical. There is therefore a significant need for an alternative method and system for replicating optical media having high-resolutions and for replicating new media types, such as those having multilayer structures and other new geometries.

SUMMARY OF THE INVENTION

The present invention provides a new method and system for producing a digital optical recording. The process can be divided into two separate operations: mastering of the optical recording on the surface of an elongated member, such as a cylinder, etc., and fast replication of the master record onto the surface of flexible film which is essentially parallel to the surface of the cylinder, etc.

In one embodiment, the mastering component of the present invention includes an elongated member, such as a cylinder or other suitably shaped member, having a defined axis of rotation. The elongated member may be made of a material transparent to irradiated energy, such as energy from a laser beam. The elongated member has an optically-thick layer on its exterior surface, which provides for a relatively small amount of the irradiated energy to pass through.

A laser beam, or another type of focused energy, may be focused on selected regions of the surface of the elongated member so as to melt, with or without ablation, corresponding regions of the optically thick layer. Through melting, the selected regions of the optically-thick layer become optically-thinner or are completely removed, thereby allowing a relatively larger amount of irradiated energy to pass therethrough. The laser beam may be controlled so as to melt regions of the optically-thick layer in order to create optically-thin regions that encode the layout of a compact disc (CD), for example. An index that maps the Cartesian coordinates of the encoding of a compact disc onto a table containing encoding information for that location may be used in order to encode the elongated member.

After the elongated member is created as a master, a uniform irradiation may be provided within the elongated member to begin the replication process. The uniform irradiation may take the form of a light source placed along the axis of rotation of the elongated member, or it may take other forms, such as a source of electromagnetic radiation in any suitable frequency band.

In order to perform the replication process, a film is provided that includes an optically perturbable layer, wherein the optically perturbable layer may be modified responsive to irradiated energy. For example, the film may include a reflective layer, and a photoresist layer on top of the reflective layer.

The elongated member is thereafter rotated about its defined axis of rotation while the photoresist layer of the film is brought into direct contact with the exterior surface of the elongated member. Because the elongated member is made of a transparent material, the photoresist layer of the film is exposed to the uniform irradiation through each of the optically-thin regions on the exterior surface of the elongated member. Thus, the photoresist layer of the film is exposed to the data encoded on the exterior of the elongated member.

After the photoresist layer is exposed as described above, the photoresist layer of the film is removed at those regions which were exposed to the uniform irradiation. The reflective layer of the film is thereafter removed, by etching, at those regions corresponding to the regions of the photoresist layer that were removed, and the entire photoresist layer is thereafter removed, thereby leaving the etched reflective layer of the film as a copy of the master.

The fast continuous replication of the master pattern of the cylinder surface onto the film is achieved by bringing the film into a uniform translational motion and the elongated member into a uniform rotational motion correspondingly. The exposure dose of the optically perturbable layer is determined by the velocity of the motion and the intensity of the uniform irradiation.

BRIEF DESCRIPTION OF THE FIGURES OF THE DRAWINGS

FIG. 3 depicts the components of a mastering system according to the teachings of the present invention.

FIGS. 7A and 7B depict a cross-sectional view and a plan view, respectively, of sample data that may be encoded on a master, according to the present invention.

DETAILED DESCRIPTION OF THE INVENTION

The present invention comprises two parts: a mastering process and system and a replication process and system. Each of these components will be described in further detail below.

1. Mastering

Before the mastering process begins, input data for recording on a CD is pre-mastered according to a specific format, for example ECMA-119 format, and is stored on a magnetic tape, magneto-optical drive, or any other high-speed, high-volume storage device 403 (see FIG. 4, described in further detail below). For purposes of the present description of the invention, reference will be made to a compact disc (CD), but it will be understood by one of ordinary skill in the art that the principles described herein will be equally applicable to other media types as well, including DVD, or any other equivalent media technology.

Figure 1A:
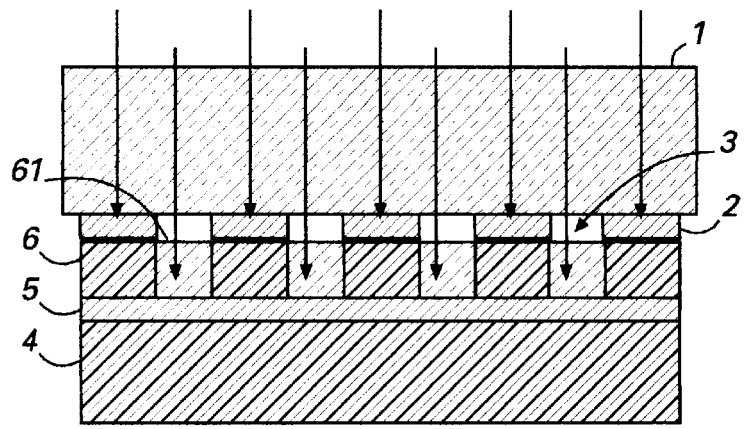
FIGS. 1A, 1B, 1C and 1D are cross-sectional views of a prior art replication method using contact photolithography.
Figure 1B:
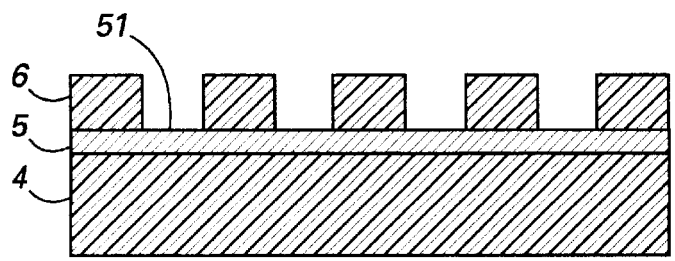
Figure 1C:
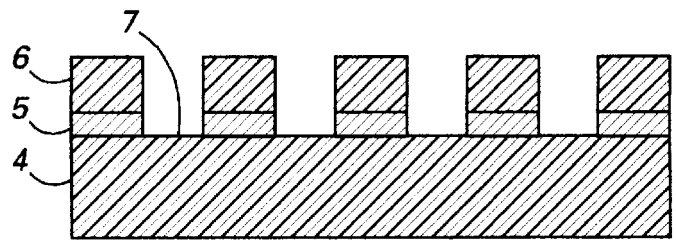
Figure 1D:
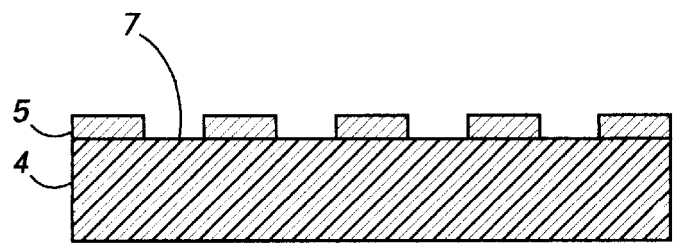
Figure 2B:
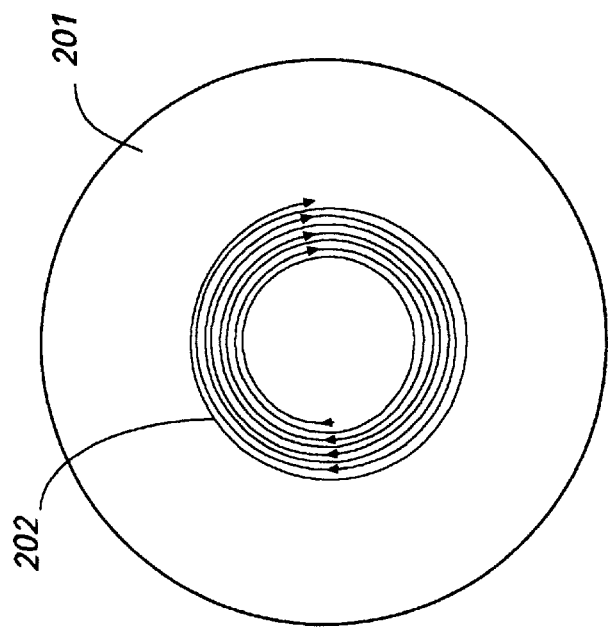
FIGS. 2A and 2B depict how data may be encoded onto a master in a rasterized manner (FIG. 2A), based upon the spiral encoding of a CD (FIG. 2B), according to the teachings of the present invention.

With reference to FIG. 2B, and as described previously, the bit sequence of a CD 201 is normally recorded as a spiral 202 defined in angular coordinates. The encoding of the data typically begins at an innermost portion of the CD, and a spiral 202 extending outward defines the serial stream of data.

Figure 2A:
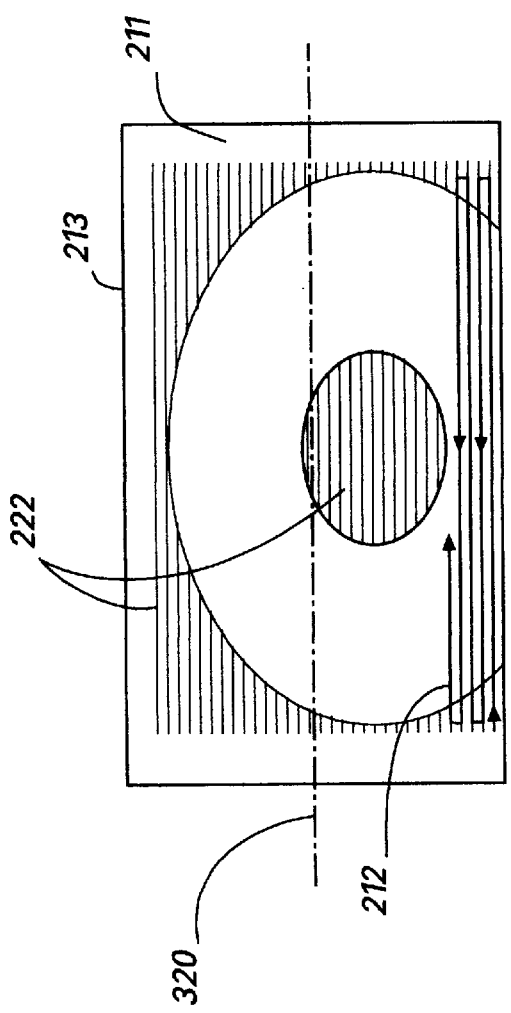

Referring to FIG. 2A, according to the teachings of the present invention, an elongated member 211, such as a hollow cylinder or any other suitably shaped member, is provided for mastering purposes. The elongated member 211 will hereinafter be referred to as the "cylinder 211", although it will be readily apparent that alternative shapes of the member 211 may also be utilized.

As will be explained in further detail below, the exterior surface 213 of the elongated member 211 may be encoded with data corresponding to the data on a CD. However, instead of encoding the data on the exterior 213 of the elongated member 211 in a spiral fashion (as shown in the prior art), the present invention introduces a novel technique whereby the data is reformatted from angular coordinates into Cartesian coordinates, in order to allow for encoding of the exterior surface 213 in a rasterized manner. The rasterized encoding of the exterior surface 213 of the cylinder 211 is described in further detail below with respect to FIG. 3.

With reference to FIGS. 2A and 3, the hollow cylinder 211 has a defined axis of rotation 320 about which it may be rotated at a controlled speed by any suitable means 305, such as with a motion controller manufactured by Newport Corporation. The rotation motion of the elongated member 211, for example, may be provided by an ultra precision rotation stage 305, part number PM500-360R. The translation motion of the optical head 302 may be provided by an ultra precision linear stage 308, part number PM500-6L.

In one embodiment, the hollow cylinder 211 may be fabricated of a UV transparent material (for example monocrystalline sapphire). The dimensions (width and diameter) of the cylinder 211 may provide enough surface area to accommodate one or more images of 120 mm CDs. For other types of media, the dimensions of the cylinder 211 may be modified as necessary. The exterior 213 surface of the cylinder 211 may be coated with a thin (e.g., 30–50 nm) layer of a low melting point alloy 250 (see FIGS. 7A, 7B and 8, and discussion), or any equivalent material.

The exterior surface area 213 of the cylinder 211 may be divided into two regions: a data region 221 that corresponds to the image of the data region of a flat CD wrapped around the cylindrical surface 213, and an auxiliary region 222. The auxiliary region 222 may contain alignment marks in the form of the 200 nm wide grooves parallel to the cylinder axis 320, or equivalent. The cross section of the grooves may be triangular, semicircular or any other shape that reduces reflectivity of the groove for a UV laser beam focused onto the groove below 60% as compared to a landing.

Referring again to FIG. 3, ultra-violet (UV) radiation of a $TEM_{00}$ mode from a CW laser (for example, a 257 nm line of an argon ion laser or a 325 nm line of a helium-cadmium metal vapor laser) may be focused onto the exterior surface 213 of the cylinder 211. The focusing of the laser radiation from the laser 302 is achieved with the help of a feedback-controlled fine focus system 317 commonly known in the art.

The fine focusing system 317 may include a single beam system or two beam system with an auxiliary infrared semiconductor laser. The positioning of the laser beam on the cylinder surface 213 may be controlled to a precision of 25 nm through two types of the motion: linear motion of the focusing system 317 of the laser 302 along the ultra precision linear stage 308, as well as rotational motion of the cylinder 211 about the axis of rotation 320 via ultra-precision rotation stage 305.

As described above, the data to be encoded on the cylinder 211 for mastering purposes must be reformatted from angular to Cartesian coordinates before a rasterized recording of the data takes place on the cylinder 211. With reference again to FIGS. 2A and 2B, while the data is traditionally encoded in a spiral fashion 202 on CDs, the present invention preferably encodes data on the master of cylinder 211 in a rasterized format 212. To accomplish this rasterizing, the focusing system 317 travels the length of the ultra-precision linear stage 308, the cylinder 211 is rotated slightly about its axis of rotation by ultra-precision rotation stage 305, and then this cycle repeats. Thus, the data is encoded according to an embodiment of the present invention in the rasterized manner depicted by reference numeral 212 of FIG. 2A.

In order for laser 302 and focusing system 317 to properly encode the data onto cylinder 211, the spiral angularly-encoded data on a CD must first be reformatted into Cartesian coordinates. Therefore, as the focusing system 317 travels the length of the linear stage 308, and as the cylinder 211 is successively rotated between each movement of the laser 302, the proper data is being encoded.

Figure 4:
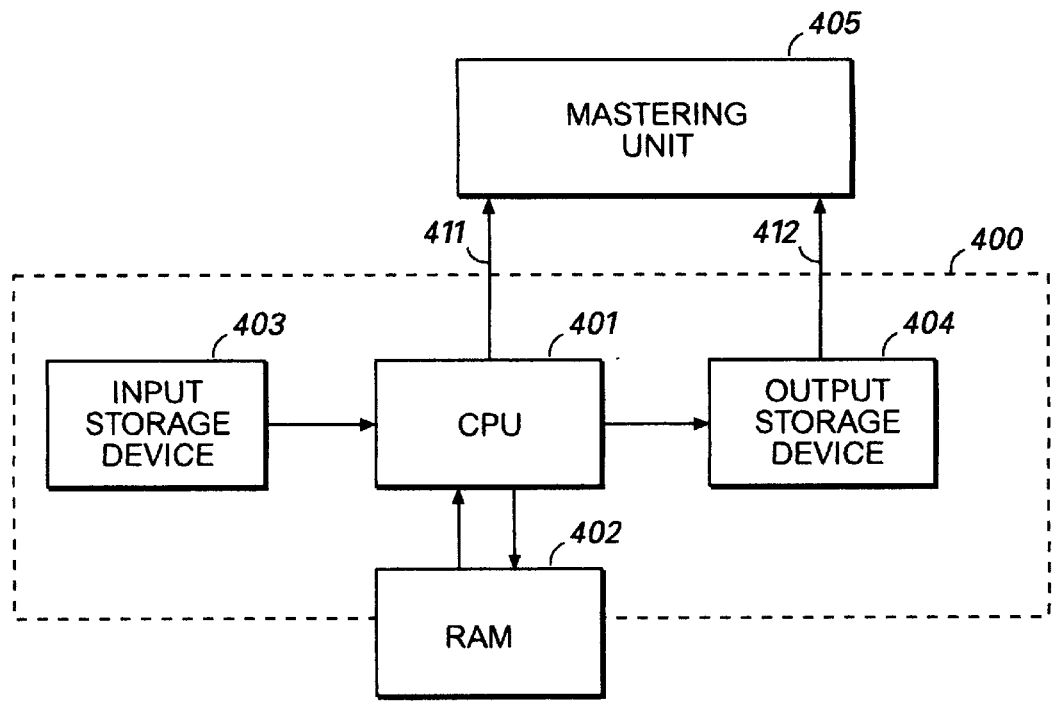
FIG. 4 depicts a computer system that may be used to implement the present invention.

FIG. 4 depicts a basic block diagram of a computer system 400 that may be used in order to convert from angular to Cartesian coordinates, so that the mastering unit 405 shown in FIG. 3 may be properly mastered. In one embodiment, the computer system of FIG. 4 may comprise a CPU 401, random access memory 402, an input storage device 403 and an output storage device 404. The storage devices 403 and 404 were previously described as magnetic tape, a magneto-optical drive, or any other high-speed, high-volume storage device. For example, the computer system of FIG. 4 may comprise a standard PC configuration with sufficient memory and processing speed, or equivalent.

Figure 5:
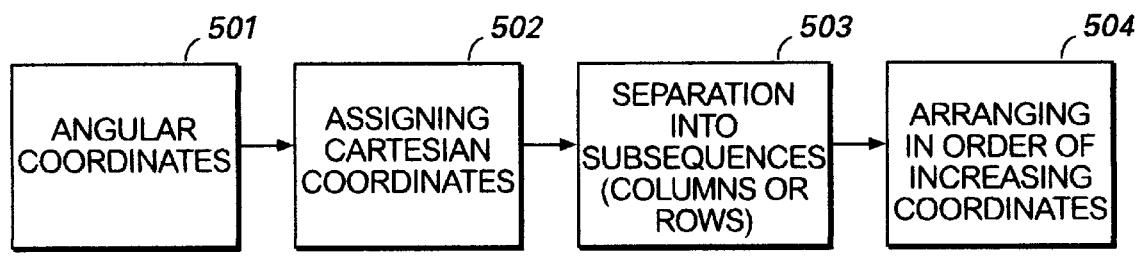
FIG. 5 is a flow diagram illustrating the basic steps that may be performed to convert spiral encoding (FIG. 2B) into rasterized Cartesian coordinate encoding (FIG. 2A), according to the teachings of the present invention.

FIG. 5 is a flow diagram depicting the various steps that may be taken by the computer of FIG. 4 to convert the angular location of each piece of data on the CD into its Cartesian coordinate equivalent. During this coordinate transformation, the position of data bits in the original sequence formatted for recording in angular coordinates (step 501) (e.g., where the recording head moves along a spiral trajectory) is changed according to Cartesian positioning (e.g., where the recording head moves along a raster trajectory) in step 502. In order to adequately map the angular coordinates to the Cartesian coordinates, the resolution of the positioning system must be sufficiently high to reproduce the original spiral pattern on the surface of the master drum 211. For CDs, this requirement infers that the precision of the laser beam positioning must be at least 50 nm for either axis. Other suitable precision may be used for other types of media.

Depending on the speed of the master encoding and data conversion, the converted bit sequence is coupled to the mastering unit 405 directly from the CPU 401 (real time process) along line 411 or from the output storage device along line 412. The steps that may be performed by CPU 401 in order to transform input angular coordinates stored on input storage device 403 into output Cartesian coordinates stored on output storage device 404 represents a standard sorting problem.

A solution to this sorting problem is to map a string of contiguous bits onto a rectangular template in such a way that the bits would be sequentially arranged along a strictly defined spiral pathway, each bit being represented by a spot region. The distance δ between the neighboring convolutions of the spiral is equal to 1.6 μm; the distance between the neighboring spot regions representing contiguous bits is 1 μm. Assuming that the scatter of every bit location cannot exceed 10% of the adjacent bits separation, each spot region has to be positioned within a square with a side of ε=0.1 μm. Thus, the square grid representing the rectangular template must have cells having a dimension of 0.1 μm by 0.1 μm. The total number of these cells within a CD area is equal to approximately $1.13 \times 10^{12}$—which is about one hundred times as many as the total number of bits in the string encoded on the CD.

To index the square cells of the above-described grid, a two-integer numeration {xy} may be used. The first integer x denotes the order number of a column from left to right; the second integer y denotes the order number of a row from the bottom to the top. The total number L of either rows or columns is equal to $1.2 \times 10^6$. The goal is to map the binary string onto the square grid {xy} so that all bit positions will be sequentially arranged along the spiral pathway.

For example, coordinates can be transformed as follows:

Formulas 1

$$x(n) = \varepsilon^{-1}\{R + r(n)\cos\varphi(n)\}$$

$$y(n) = \varepsilon^{-1}\{R + r(n)\sin\varphi(n)\}$$

where:

$$\phi(n) = 2\pi\delta^{-1}\{r(n) - R_0\}$$

$$r(n) = [R_0^2 + D\delta\pi^{-1}n]^{1/2}$$

R=radius of the last outer convolution (track), R≈60 mm;

$R_0$=radius of the first inner convolution (track), $R_0$≈20 mm;

n=a bit order number in the binary string starting from 0 up to N−1;

N=the total number of the bits in the string, N≅$10^{10}$;

r(n)=distance between the spot region corresponding to n-th bit and the center of the disk;

D=fixed distance between the neighboring spot regions along the spiral pathway, D≅1 μm;

δ=fixed distance between the neighboring convolutions (track pitch), δ≅1.6 μm;

x and y=rectangular coordinates with the origin in the center of the disk; and

ε=the size of the elementary cell, δ=0.1 μm.

The set of pairs {x(n),y(n)} obtained by the Formulas 1 above is arranged in order of increasing n. In order to produce the binary string that can be used for mastering, this sequence must be rearranged in order of increasing x and y. In other words, the dependence of {xy} on n must be inversed into dependence of n on {xy}, keeping in mind that {x,y} only assume some certain integer values defined by the above Formulas 1. Taking into account the great length of the sequence, initial subsequences suitable for placement into fast RAM may be subdivided in step 503. More specifically, the following set of subsequences (which are the columns) must be obtained for each fixed x:

$$n\{0, y\}; n\{1, y\}; n\{2, y\}; n\{3, y\}; \ldots n\{x, y\}; \ldots n\{L-1, y\}$$ Formula 2 where:

L=1.2×$10^6$, and is the total number of the columns (or the rows).

In step 504, each column (subsequence) from Formula 2 is arranged in order of increasing row number y, as indicated below:

$$n\{x, y\}=n\{x, y_1\}, n\{x, y_2\}, n\{x, y_3\}$$ Formula 3 where $0<y_1<y_2<y_3<y_4 \ldots <L-1$.

Obviously, the row-number y for each subset n {x, y} from Formula 3 assumes only a small part of integer values between 0 and L−1; every corresponding value describes the spot region position of the corresponding bit n of the string.

Figure 6:
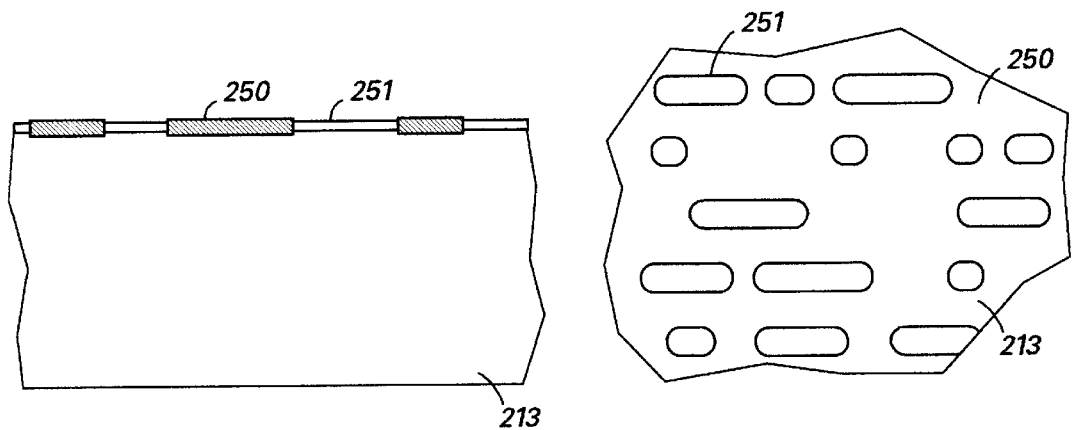
FIG. 6 is a sample portion of a table that may be created based upon the basic steps of FIG. 5, according to the teachings of the present invention.

FIG. 6 shows a sample table that may be created by the steps of FIG. 5, as described previously. The bits of the table of FIG. 6 are taken from an actual CD, although they represent merely a sampling of the various bits on the CD. Relative numbers 1 through 10 in the first column 601 (polar coordinates n{φ,r}) are assigned merely for convenience.

The second column 602 and the third column 603 of the table of FIG. 6 represent the angular coordinates φ(n) and r(n), respectively. The next two columns 604 and 605 contain the calculated cartesian coordinates x(n) and y(n), respectively. Based upon the value of the Cartesian coordinates, a new integer number n{x,y} 606 is assigned to the bit of data. Again, the final step 504 in creating a table that may be used for mastering is to sort the rows of the table such that the bit 606 is arranged in the order of increasing n{x,y}.

Once the table of FIG. 6 is created mapping the angular location of data to the Cartesian coordinate location, the laser beam 302 may be controlled by the modulator 303 so as to encode data on the exterior of the cylinder 211. As the laser 302 travels the rasterized path generally depicted by reference numeral 212 of FIG. 2A, the table of FIG. 6 is used to determine the corresponding data location in the spiral of reference numeral 202. Thus, at each point along the path of the laser 302, where the cylinder 211 has been rotated a known amount, the laser may be modulated so as to encode the appropriate data onto the exterior surface of the cylinder 211. The modulation of the laser 302 is described in further detail below.

In order to encode the data onto the cylinder 211, the laser 302 may be controlled by an acousto-optical modulator 300 so as to focus its energy onto the exterior surface of the cylinder 211 in such a way that the metal alloy 250 is melted. The laser radiation is precisely coupled to the fine-focus actuator 317 mounted onto the linear stage 308 by means of a single-mode optical fiber 315. In one embodiment, the intensity of the focused laser radiation from the laser 302 is controlled to be above the threshold of the local melting of the metal coating 250 of the cylinder 211 and below the threshold of the local ablation of the same metal coating 250. The exposure to the laser emissions of the laser 302 of the metal coating 250 on the surface of the cylinder 213 results in local melting of the metal coating 250. Upon melting, the liquid metal 250 tends to accumulate at the edges of the solid phase material, thus forming an aperture 251 (see FIGS. 7A, 7B and 8, and discussion) in the previously uniform coating 250.

In one embodiment, the intensity of the laser 302 is chosen such that no ablation occurs in the metal coating 250 of the cylinder 211. In this case, the heat generated by the laser 302 on the surface of the cylinder 211 may be controlled so as to be above the melting point of the metal coating 250 on the surface of the cylinder 211, but below the melting point of the transparent material of the cylinder 211 itself In another embodiment, the intensity of the laser 302 is chosen such that ablation does occur in the metal coating 250. At the same time, the power density of the UV light 910 during the film 901 exposure is orders of magnitude less than for mastering with a focused laser beam—therefore melting never occurs during replication (described in further detail below).

The intensity of the UV laser radiation emitted by the laser 302 may be modulated by an electro-optical modulator 300, by a magneto-optical modulator 300, or the like, under the control of CPU 401. The CD master data represented in Cartesian coordinate format, and stored in storage device 404, is used to modulate the laser beam. If the energy from a focused laser pulse from the laser 302 is greater than the ablation threshold of the alloy coating 250 on the surface of the cylinder 211, a feature consisting of a circular opening 251 is formed at that location. This aperture 251 is optically-thin when compared to the unmastered metal coating 250, and allows irradiated energy, such as UV radiation emitted from within the cylinder 211, to pass therethrough. The UV radiation from within the cylinder 211 is used in the replication process of the present invention, and will be described in further detail below. By selectively repeating the melting step described above while the position of the modulated focused laser beam is shifted along the raster path 212, a plurality of data regions, each representing a binary bit of recording information, is formed on the surface of the cylinder 211. FIGS. 7A and 7B depict a cross-section view and a plan view, respectively, of data regions encoded on a portion of the surface 213 of cylinder 211.

The data pattern encoded onto the cylinder 211, as described above, is analogous to the features generated on the surface of a glass master formed by a conventional mastering process, although there are two principal and significant differences: (1) the mastering process of the present invention takes place on a three-dimensional cylindrical surface 213, while conventional mastering is carried out on a two-dimensional plane; and (2) in the present invention the laser beam from laser 302 performs a rastering motion (e.g., FIG. 2A), while in the conventional mastering process the laser beam encodes the CD in a spiral manner (e.g., FIG. 2B).

The master cylinder 211 of the present invention may be re-mastered many times. Specifically, the melted recording 250, 251 on the surface 213 of the cylinder 211 can be erased by uniformly heating above the melting point of the alloy. When melted, the alloy 250 spreads itself uniformly over the entire surface and fills in the apertures 251 created by local melting or laser ablation. After solidification, the mastering process can be repeated as described in the previous paragraphs. While cylinders 211 may generally be reused, extensive use of the master cylinder 211 may cause partial loss of the alloy material due to ablation. However, the missing material can readily be replenished by evaporation of additional alloy 250 onto the cylinder surface 213. The heating and reflow of the cylinder can be carried out within the same apparatus that is used for mastering.

2. Replication

Once the cylinder 211 has been encoded with data, replication of the encoded data may be performed. Through the use of the replication teachings of the present invention, the master pattern from the cylinder surface 213 may be replicated onto flexible substrate 901 very quickly through the use of contact photolithography or equivalent techniques. By providing the media substrate in the form of a continuous web of film material 901, extremely high replication rates can be achieved, as will be described in further detail below.

Figure 8:
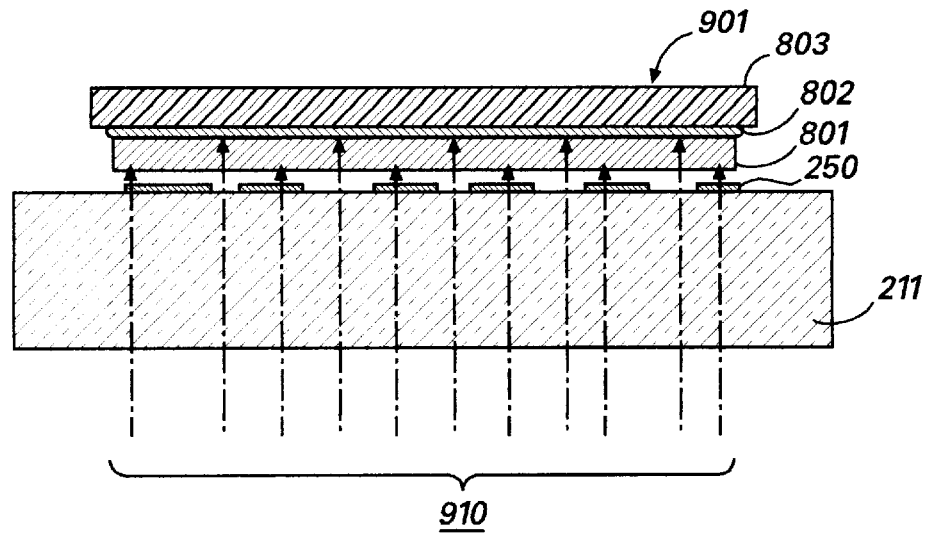
FIG. 8 depicts a cross-sectional view of film that may be used in the replication phase of the present invention.
Figure 9:
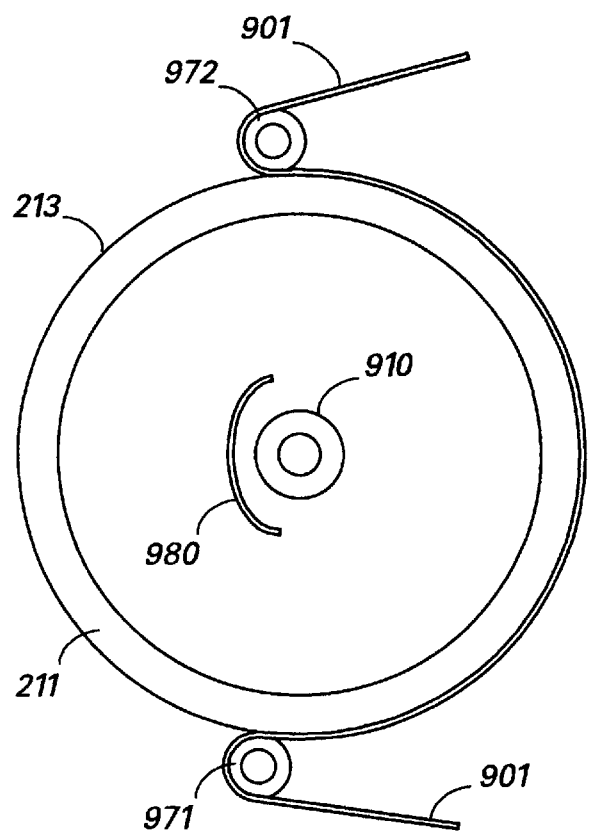
FIG. 9 depicts components that may be used during the replication phase of the present invention.
Figure 10:
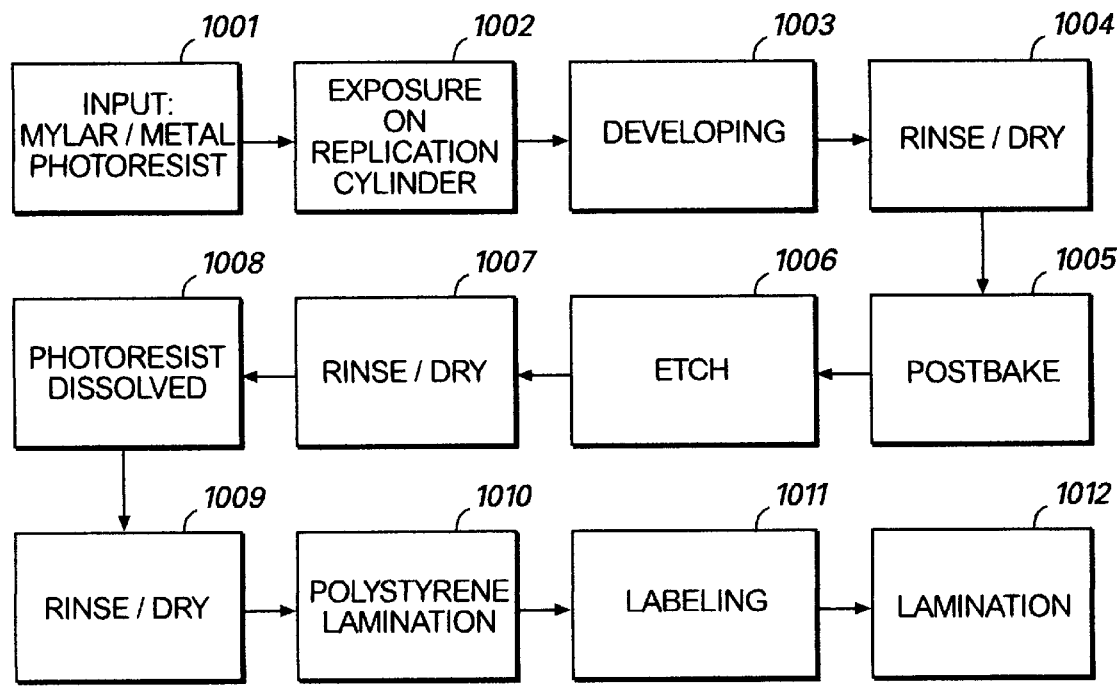
FIG. 10 is a flow diagram illustrating the basic steps that may be performed during the replication phase of the present invention.

The replication process is described with reference to FIGS. 8, 9 and 10. FIGS. 8 and 9 depict structural components of the replication portion of the present invention, while FIG. 10 depicts the various steps that may be performed during the replication process. Throughout the discussion below, reference will be made to the steps of FIG. 10.

Step 1001. Referring to FIG. 9, a flexible film 901, such as a three layer film, is provided. FIG. 8 provides, in part, a cross-section of the film 901 of FIG. 9. Referring to FIG. 8, the film 901 may comprise, for example, a 0.1 to 1.0 μm layer of positive photoresist 801 (for example Shipley 505A photoresist) coupled to an approximately 0.05 μm layer of reflective coating 802 (for example aluminum) which is coupled to a 15 to 200 μm flexible polymer film 803 (for example DuPont Mylar type D film). Of course, these thicknesses comprise merely one embodiment of the flexible film 901—other appropriate thicknesses and equivalent materials may work as well.

The elements 801, 802 and 803 of the film structure 901 serve the following purposes: the photoresist layer 801 is a photosensitive layer which may be selectively exposed through transparent regions of the cylinder 211; the aluminum layer 802 is a reflective media which is subsequently encoded later in the replication process; and the polymer film 803 is a flexible but stable substrate which provides the means of continuous transport of the media layer through repeated steps of the replication process. The photoresist layer 801 and aluminum layer 802 together form an optically perturbable layer that may subsequently be modified responsive to irradiated energy, as will be described in further detail below.

Step 1002. A linear UV light source 910 (for example a long-arc high-pressure gas lamp) is placed coaxial to the axis of rotation 320 of the cylinder 211, such that its irradiated energy is uniformly emitted radially. To expose the photoresist layer 801, the three-layer composite film 901 is brought into intimate contact with exterior surface 213 of the cylinder 211, as shown in FIG. 9. FIG. 8 shows a magnified view of a cross-sectional area of the cylinder surface 213 in contact with the composite film 901. During exposure, the UV radiation from the linear source 910 inside the cylinder 211 is transmitted through the transparent structure of the cylinder 211, through any apertures 251 in the metal coating 250 of the exterior surface 213 of the cylinder 211, and reaches the areas of the photoresist layer 801 which are located over the apertures 251 in the cylinder surface 213. The apertures 251 in the cylinder surface are those apertures created during the mastering process, described previously.

The cylinder 211 rotates while the film web 901 is fed by a system of rollers 971 and 972—the linear velocity of the outer surface 213 of the master cylinder 211 at any given moment of time is equal to the linear velocity of the film web 901 being fed by the rollers 971 and 972. The exposure starts when the film web 901 is brought into contact with the cylinder surface 213 at roller 971, and ends when the film web 901 is separated from the cylinder 211 at roller 972. An opaque screen 980 may be provided to protect the film web 901 from exposure before the contact with the cylinder 211, and after the separation. The exposure dose is defined by the intensity of the linear light source 910 and by the linear velocity of the film web 901.

The preferred intensity of the light source 910 and the preferred linear velocity of the film web 901 may be linearly related, and may be expressed by the following Formula 4:

$$Dv=I \qquad \text{Formula 4}$$

where:

D=photoresist 801 dosage requirements in $J/cm^3$;

v=linear velocity in cm/sec.; and

I=intensity of the irradiated energy from linear light source 910, in $J/(sec. \; cm^2)$.

The optical and mechanical geometry used in the present invention offers the following important advantages:

exposure takes place while the film 901 is in motion.

the gap between the cylinder surface 213 and the film 901 is readily minimized due to the configuration shown in FIG. 9, resulting in maximum possible encoding resolution.

complicated optics typically used in the flat field mask aligning of the prior art in order to achieve exposure uniformity are replaced by an inexpensive and effective linear light source 910.

After the photoresist layer 801 is exposed as described above, the following steps may be performed to develop the photoresist 801, etch the reflective layer 802, and remove the photoresist 801. These steps correspond to standard procedures for processing photoresist material:

1. Step 1003. After exposure, the film 901 is developed and pits are formed where exposed photoresist 801 is washed away. A photoresist mask is thereby formed with the pits in the photoresist 801 corresponding by dimension and position to the apertures 251 in the metal coating 250 of the cylinder surface 213.

2. Step 1004. The film 901 is rinsed in deionized water and dried.

3. Step 1005. The photoresist is postbaked at a temperature of 100° C.
4. Step 1006. The aluminum reflective layer 802 is etched through the pits in the photoresist 801 by a base etch, such as sodium hydroxide (NaOH) solution. A dry plasma etch may be used as well.
5. Step 1007. The film 901 is rinsed in deionized water and dried.
6. Step 1008. The photoresist 801 is washed away by an organic solvent.
7. Step 1009. The film is rinsed in deionized water and dried By carrying out the contact exposure, and the seven steps 1003–1009 described above, the encoded pattern on the surface 213 of the cylinder 211 is transferred onto the photoresist layer 801 by exposure and developing, and is subsequently transferred from the photoresist layer 801 onto the metal layer 802 of the film web 901 by etching. As a result, the plurality of apertures with reduced reflectivity in the aluminum layer 802 of the film web 901 represent a digital recording readable by an optical playback device, such as a standard CD player.

Figure 11:
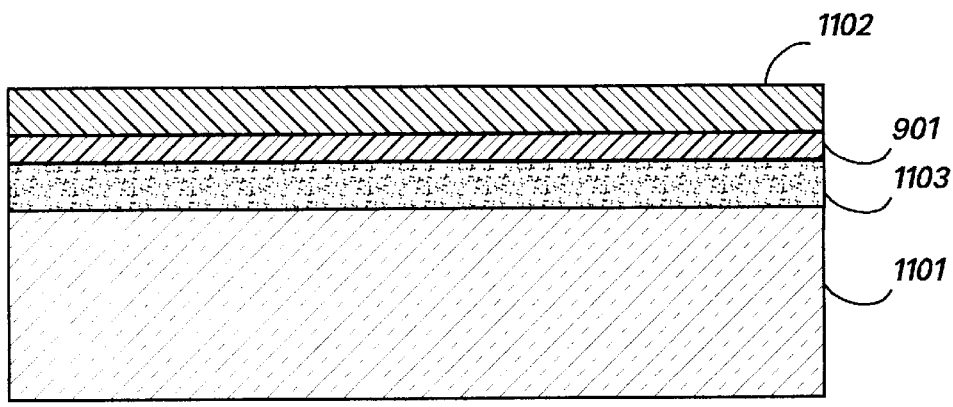
FIG. 11 is a cross-sectional view of a final CD product made in accordance with the teachings of the present invention.

Step 1010. With reference to FIG. 11, in order to make the thin film 901 compatible with standard playback devices, the thickness of the media 901 may be increased to between 1.0 and 1.2 mm by adding a layer of transparent nonbirefringent media 1101 of optical grade, and the CD pattern may be identified in the film web 901 according to standard CD dimensions. A 1.2 mm thick polystyrene 1102 may be laminated on the flexible substrate with a refraction index matching adhesive 1103, and subsequently cured in a microwave field. After this step the sandwich sheet structure 1101, 901 and 1102 (for example: 1.2 mm polystyrene over 2 μm 0.05 μm aluminum pattern over 50 μm Mylar substrate) will not be as flexible, should preferably be subsequently processed as a rigid sheet.

Step 1011. 1012. The last procedure in the replication is to separate individual discs from the web using a precision water knife. Alignment marks made during the lithographic process may provide accuracy for the center hole and perimeter cuts. Labels can be printed on the finished CD either before or after separation from the film web 901. By printing the labels on the CD before separation from the film web 901, automated efficiencies, such as using offset printing, may be achieved. However, labeling of individual disc after separation from the web 901 may also be performed by the methods and by the machines currently used by the industry, such as those using silk screen techniques.

The mastering and replication processes of the present invention provide numerous important advantages over the prior art, including The mastering process is greatly simplified. If necessary, it may be carried out within a compact enclosure and does not require the use of a much more expensive cleanroom facility. The duration of the mastering process may be from 1 to 1.5 hours (or less), as opposed to 4–5 hours minimum in the prior art processes (including photoresist coating and inspections).

The steps of creating the father, mother and stamper production units are eliminated.

The mastering and replication processes may be carried out by essentially the same apparatus, which may be relatively compact.

The cylinder 211 of the present invention allows the media film 901 to be exposed while it is in continuous motion. All consequent steps of the replication process may be carried out while the media film 901 is transported continuously.

The continuity of the replication process provides an increased yield at a smaller cost. Depending on the size of the cylinder 211, the process of the present invention may yield a CD every 0.1 to 0.3 seconds (or less) at a cost of approximately 5 cents per unit (or less).

The contact photolithography during replication takes place on a cylindrical surface 213. This eliminates difficulties typical for the contact photo lithography on a rigid flat surface, while increasing resolution.

Feature resolution achievable through use of the present invention may be 250 nm, or even less. This exceeds the requirements imposed by newly introduced high density recording standards.

The microscopic features on the media film 901 are fabricated by optical and chemical means only. The mechanical alteration of surface morphology is excluded entirely and, therefore, nonuniformities caused by the mechanical stress and corresponding birefringence are eliminated.

The process is carried out at the temperatures below 180° F., and therefore temperature gradients and corresponding birefringence are eliminated.

Reduced birefringence allows the use of materials substantially cheaper than polycarbonate plastic as the transparent substrate of the cylinder 211.

Improved resolution and decreased birefringence provides reduced error rates and allows the use of higher speed playback devices.

The replication method of the present invention is suitable for production of multilayer structures, such as those that are being introduced in new optical media technologies.

While the invention has been described in detail with specific reference to preferred embodiments thereof, it is understood that variations and modifications thereof may be made without departing from the spirit and scope of the invention.

We claim:

1. A system for encoding data regions on optical media, comprising:
   (a) an optically-transparent elongated rigid member having a defined axis of rotation wherein the elongated rigid member has a relatively low transmissivity at its exterior surfaces;
   (b) means for rotating the elongated rigid member about its defined axis;
   (c) means for focusing energy onto the exterior surface of the elongated rigid member, wherein the energy focusing means is movable along a linear stage in a first direction parallel the axis and a second direction which is the opposite direction of the first direction;
   (d) means for controlling the energy focusing means and the elongated rigid member rotating means so that when the energy focusing means travels the length of the linear stage in the first direction, the elongated rigid member rotating means rotates the elongated rigid member abut the axis slightly to allow the energy focusing means to travel along the linear stage in the second direction so as to focus energy upon selected regions of the exterior surface in a continuous rasterized trajectory whereby the focused energy melts the exterior surface at the selected regions, thereby forming regions having relatively high transmissivities at the exterior surface of the elongated rigid member, the controlling means comprising:

(i) means for sequentially storing a plurality of data bits found on an optical medium, wherein each of the plurality of data bits is stored in the storing means and has a unique angular location on the optical medium;

(ii) means for obtaining an associated Cartesian coordinate location equivalent for each of the plurality of data bits, wherein the associated Cartesian coordinate is stored the storing means;

(iii) means for controlling the energy focusing means such that the focused energy hits the exterior surface at the Cartesian coordinate location for each of the plurality of data bits having a selected digital value, thereby forming regions having relatively high transmissivities at the exterior surface of the elongated rigid member;

(e) means for providing irradiation from within the elongated rigid member;

(f) a film including a photoresist layer responsive to the irradiation;

(g) means for rotating the elongated rigid member about its defined axis of rotation while bringing the film into direct contact with the exterior surface of the elongated rigid member, wherein the film is exposed to the irradiation through each region of the exterior surface having a relatively high transmissivity; and (h) development means for modifying the photoresist layer of the film at those regions which were exposed to the irradiation.

2. The system of claim 1, wherein the optical medium is a compact disc.

3. The system of claim 1, wherein the development means further comprises:

(iii) means for removing the remaining photoresist layer from the film.

4. A method for encoding data regions on optical media, comprising the steps of:

(a) obtaining a plurality of data bits found on an optical medium, wherein each of the plurality of data bits has a unique angular location on the optical medium;

(b) converting each of the plurality of data bits from its unique angular location to an associated Cartesian coordinate;

(c) creating a plurality of regions defined by the Cartesian coordinates for the plurality of data bits along a continuous raster path at the exterior surface of an optically-transparent elongated rigid member, the plurality of regions having relatively high transmissivities, and wherein the elongate rigid member has a defined axis of rotation;

(d) providing irradiation from within the elongated rigid member;

(e) coating a film with a photoresist layer;

(f) rotating the elongated rigid member about its defined axis of rotation while bringing the film into direct contact with the exterior surface of the elongated rigid member, whereby the film is exposed to the irradiation through each region of the exterior surface having a relatively high transmissivity; and (g) modifying the photoresist layer of the film at those regions which were exposed to the irradiation.

5. The system of claim 4, wherein the optical medium is a compact disc.

6. A method for encoding data regions on optical media, comprising the steps of:

(a) obtaining a plurality of data bits found on an optical member, wherein each of the plurality of data bits has a unique angular location on the optical medium;

(b) converting each of the plurality of data bits from its unique angular location to an associate Cartesian coordinate;

(c) creating a plurality of regions defined by the Cartesian coordinates for the plurality data bits along a continuous raster path at the exterior surface of an optically-transparent elongated rigid member, the plurality of regions having relatively high transmissivities, and wherein the elongated rigid member has a defined axis of rotation;

(d) providing irradiation from within the elongated rigid member;

(e) coating a film with a reflective layer and a photoresist layer;

(f) rotating the elongated rigid member about its defined axis of rotation while bringing the photoresist layer of the film into direct contact with the exterior surface of the elongated rigid member, wherein the photoresist layer of the film is exposed to the irradiation though each region of the exterior surface having a relatively high tranamissivity;

(g) removing the photoresist layer of the film at those regions which were exposed to the irradiation; and (h) removing the reflective layer of the film at those regions that are adjacent to the regions of the photoresist layer that were removed by the removing means.

7. The system of claim 6, wherein the optical medium is a compact disc.

8. A method for encoding data regions on optical media, comprising the steps of:

(a) obtaining a plurality of data bits found on an optical medium, wherein each of the plurality of data bits has a unique angular location on the optical medium;

(b) converting each of the plurality of data bits from its unique angular location to an associated Cartesian coordinate;

(c) creating a relatively low transmissivity at the exterior surface of an optically-transparent elongated rigid member, wherein the elongated member has a defined axis of rotation;

(d) focusing energy upon regions corresponding to the Cartesian coordinates for the plurality of data bits on the exterior surface of the elongated rigid member along a continuous raster path at the exterior surface, whereby the focused energy melts the exterior surface at the selected regions, thereby forming regions having a relatively high transmissivity on the exterior surface;

(e) providing irradiation from within the elongated rigid member;

(f) coating a film with a photoresist layer;

(g) rotating the elongated rigid member about its defined axis of rotation while bring the film into direct contact with the exterior surface of the elongated rigid member, wherein the film is exposed to the irradiation through each region of the exterior surface having a relatively high transmissivity; and (h) modifying the photoresist layer of the film at those regions which were exposed to the irradiation.

9. The system of claim 8, wherein the optical medium is a compact disc.

10. A system for encoding data regions on optical media, comprising:
- (a) an optically-transparent rigid cylinder having a first axis of rotation, wherein the cylinder has a relatively low transmissivity at its exterior;
- (b) a rotator to rotate the cylinder about the first axis;
- (c) a linear stage with a second axis, wherein the second axis is parallel to the first axis;
- (d) a movable laser device associated with the linear stage for focusing laser onto the exterior surface of the cylinder, wherein the laser device may move along the linear stage;
- (e) a controller for controlling the movable laser device and the rotator so that when the movable laser device travels the length of the linear stage along the second axis, the rotator subsequently rotates the cylinder about the first axis of rotation slightly to allow the movable laser device to travel along the linear stage back and forth along the second direction so as to focus energy upon selected regions of the exterior surface in a continuous rasterized trajectory, whereby the focused energy melts the exterior surface at the selected regions, thereby forming regions having relatively high transmissivities at the exterior surface of the cylinder, wherein the controller comprises:
  - (i) a memory for storing a plurality of data bits found on an optical medium, wherein each of the plurality of data bits is stored in the memory and has a unique angular location on the optical medium;
  - (ii) a CPU for providing an associated Cartesian coordinate for each of the plurality of data bits corresponding to its unique angular location, wherein the associated Cartesian coordinate is stored in the memory; and
  - (iii) means for controlling the movable laser device such that along the rasterized trajectory, the focused energy only hits the exterior surface at regions defined by the Cartesian coordinate for each of the plurality of data bits having a selected digital value, thereby forming regions having relatively high transmissivities at the exterior surface of the cylinder;
- (f) a light source far providing irradiation from within the cylinder;
- (g) a photoresist layer responsive to the irradiation;
- (h) a reflective layer located in proximity to the photoresist layer;
- (i) at least one roller for bringing the photoresist layer with the reflective layer into direct contact with the exterior surface of the cylinder, wherein the photoresist layer receives the irradiation through the regions having relatively high transmissivities at the exterior surface of the cylinder;
- (j) means for removing the photoresist layer at those regions which were exposed to the irradiation; and
- (k) means for removing the reflective layer at those regions that are adjacent to the regions of the photoresist layer that were removed.

11. The system of claim 10, wherein the optical medium is a compact disc.

* * * * *